(12) United States Patent
Kawabata et al.

(10) Patent No.: US 12,501,582 B2
(45) Date of Patent: Dec. 16, 2025

(54) VAPOR CHAMBER

(71) Applicant: Furukawa Electric Co., Ltd., Tokyo (JP)

(72) Inventors: Kenya Kawabata, Tokyo (JP); Yoshikatsu Inagaki, Tokyo (JP); Hirofumi Aoki, Tokyo (JP); Hiroshi Okada, Tokyo (JP); Yosuke Watanabe, Tokyo (JP); Hideaki Kawabata, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 18/308,501

(22) Filed: Apr. 27, 2023

(65) Prior Publication Data
US 2023/0269910 A1 Aug. 24, 2023

Related U.S. Application Data

(63) Continuation of application No. PCT/JP2022/015837, filed on Mar. 30, 2022.

(30) Foreign Application Priority Data

Mar. 31, 2021 (JP) ................. 2021-061169

(51) Int. Cl.
*H05K 7/20* (2006.01)
(52) U.S. Cl.
CPC ................ *H05K 7/20336* (2013.01)
(58) Field of Classification Search
CPC ............ H05K 7/20336; F28D 15/0275; F28D 15/0233; F28D 15/046
See application file for complete search history.

(56) References Cited

U.S. PATENT DOCUMENTS

| | | | |
|---|---|---|---|
| 3,598,180 A | 8/1971 | Moore | |
| 6,997,245 B2 | 2/2006 | Lindemuth et al. | |
| 7,028,759 B2 * | 4/2006 | Rosenfeld | F28D 15/046 |
| | | | 165/104.21 |

(Continued)

FOREIGN PATENT DOCUMENTS

| CN | 104976909 A | 10/2015 |
|---|---|---|
| CN | 110476032 A | 11/2019 |

(Continued)

OTHER PUBLICATIONS

Notice of Examination Opinion for Taiwanese Patent Application No. 111112444 dated May 3, 2023, pp. all.

(Continued)

*Primary Examiner* — Miguel A Diaz
*Assistant Examiner* — Khaled Ahmed Ali Al Samiri
(74) *Attorney, Agent, or Firm* — Dorsey & Whitney LLP

(57) ABSTRACT

A vapor chamber including a container having a cavity portion formed inside, and including a first surface and a second surface opposing the first surface, a working fluid sealed in the cavity portion, and a vapor flow path through which the working fluid in a gas phase flows, the vapor flow path being provided in the cavity portion, wherein a container inner surface area increasing unit including a protruding part is formed on an inner surface of the first surface, and a first wick structure is provided on a surface of the protruding part.

17 Claims, 6 Drawing Sheets

(56) References Cited

U.S. PATENT DOCUMENTS

| | | | |
|---|---|---|---|
| 2004/0069455 A1 | 4/2004 | Lindemuth et al. | |
| 2005/0098303 A1 | 5/2005 | Lindemuth et al. | |
| 2007/0295486 A1* | 12/2007 | Su | F28D 15/046 |
| | | | 165/104.26 |
| 2009/0159242 A1 | 6/2009 | Zhao et al. | |
| 2009/0159243 A1 | 6/2009 | Zhao et al. | |
| 2013/0112376 A1 | 5/2013 | Zhao et al. | |
| 2015/0198375 A1 | 7/2015 | Saito et al. | |
| 2020/0003501 A1 | 1/2020 | Wakaoka | |
| 2021/0247147 A1* | 8/2021 | Tain | F28F 3/14 |
| 2022/0214115 A1* | 7/2022 | Liu | F28D 15/02 |
| 2022/0295669 A1* | 9/2022 | Wang | F28D 15/0233 |

FOREIGN PATENT DOCUMENTS

| | | |
|---|---|---|
| JP | 2015132399 A | 7/2015 |
| JP | 2018189349 A | 11/2018 |
| JP | 2019082264 A | 5/2019 |
| TW | 201843416 A | 12/2018 |
| WO | 2019065728 A1 | 4/2019 |

OTHER PUBLICATIONS

[English Translation] Decision to Grant a Patent for Japanese Patent Application No. 2021-061169 dated Apr. 28, 2022, pp. all.
[English Translation] Notice of Examination Opinion for Taiwanese Patent Application No. 111112444 dated Dec. 7, 2022, pp. all.
[English Translation] Notice of Reasons for Refusal for Japanese Patent Application No. 2021-061169 dated Jan. 17, 2022, pp. all.
International Search Report and Written Opinion (English Translation for ISR only) for International Patent Application No. PCT/JP2022/015837 mailed May 10, 2022, pp. all.

* cited by examiner

VAPOR CHAMBER

CROSS REFERENCE TO RELATED APPLICATIONS

The present application is a continuation application of International Patent Application No. PCT/JP2022/015837 filed on Mar. 30, 2022, which claims the benefit of Japanese Patent Application No. 2021-061169, filed on Mar. 31, 2021. The contents of these applications are incorporated herein by reference in their entirety.

BACKGROUND

Technical Field

The present disclosure relates to a vapor chamber that can reduce thermal resistance at a time of a working fluid in a liquid phase changing in phase to a gas phase, and can prevent dry-out of the working fluid in a liquid phase in an evaporation unit, by an evaporation surface area for the working fluid in a liquid phase being increased.

Background

In electronic components such as semiconductor devices that are mounted on electric/electronic equipment, the heat generation amount increases due to high-density mounting and the like accompanying high functionality, and in recent years, cooling of the electronic components has become increasingly important. Further, due to high-density mounting or the like accompanying miniaturization of electric/electronic equipment, electronic components may be installed in narrow spaces, and cooling of the electronic components installed in the narrow spaces becomes increasingly important. As a cooling method for heating elements of electronic components or the like having large heat generation amounts and mounted in a limited space, a vapor chamber that is a planar heat transport device may be used.

From the above, excellent heat transport properties are required of vapor chambers. Thus, for example, a vapor chamber is proposed, which has a container, pillars disposed in an internal space of the container to support the container from inside, a working fluid sealed in the internal space of the container, and a wick structure disposed in the internal space of the container, wherein at least a part of an internal surface of the container is exposed to the internal space of the container, and has pores having an average depth of 10 nm or more (Japanese Patent Laid-Open No. 2018-189349). In Japanese Patent Laid-Open No. 2018-189349, impurity gas is trapped by the pores, whereby the amount of impurity gas adhering to the wick structure is reduced, and flowability of the working fluid is enhanced. By enhancing the flowability of the working fluid, improvement of the heat transport properties of the paper chamber is achieved.

However, the vapor chamber of Japanese Patent Laid-Open No. 2018-189349 that enhances flowability of the working fluid by reducing the amount of the impurity gas adhering to the wick structure has a need for improvement in heat transport properties, as a cooling unit of the heating element having a large heat generation amount. Thus, it is also considered to improve the heat transport properties of the vapor chamber by improving the evaporation properties of the working fluid in a liquid phase by increasing the thickness of the wick structure, improving the heat conductivity by devising the material of the wick structure and the like.

However, there is still a need for improvement as the cooling unit of a heating element having a large heat generation amount, by improvement in evaporation properties of the working fluid in a liquid phase by increasing the thickness of the wick structure, improving the heat conductivity of the wick structure and the like.

SUMMARY

The present disclosure is related to providing a vapor chamber having excellent heat transport properties by reducing thermal resistance at a time of a working fluid in a liquid phase changing in phase to a gas phase, and preventing dry-out of the working fluid in a liquid phase in an evaporation unit.

The gist of the present disclosure is as follows.

{1} A vapor chamber including a container having a cavity portion formed inside, and including a first surface and a second surface opposing the first surface, a working fluid sealed in the cavity portion, and a vapor flow path through which the working fluid in a gas phase flows, the vapor flow path being provided in the cavity portion,
  wherein a container inner surface area increasing unit including a protruding part is formed on an inner surface of the first surface, and a first wick structure is provided on a surface of the protruding part.

{2} The vapor chamber according to {1}, wherein a ratio of a height of the protruding part to a thickness of the protruding part is 1.0 or more and 3.0 or less.

{3} The vapor chamber according to {1} or {2}, wherein the container inner surface area increasing unit includes a plurality of the protruding parts, and the protruding parts are each provided to be separated from the other adjacent protruding parts by 0.4 mm or more.

{4} The vapor chamber according to any one of {1} to {3}, wherein a thickness of the first wick structure is 0.1 mm or more and 1.0 mm or less.

{5} The vapor chamber according to any one of {1} to {4}, wherein the surface of the protruding part is covered with the first wick structure.

{6} The vapor chamber according to any one of {1} to {5}, wherein the first wick structure extends to among a plurality of the protruding parts in an inner surface of the first surface.

{7} The vapor chamber according to any one of {1} to {6}, wherein on the first wick structure provided on the surface of the protruding part, a second wick structure different from the first wick structure is further provided.

{8} The vapor chamber according to {7}, wherein the second wick structure has a smaller capillary force than the first wick structure.

{9} The vapor chamber according to {7} or {8}, wherein the second wick structure contacts an inner surface of the second surface.

{10} The vapor chamber according to any one of {7} to {9}, wherein the second wick structure is further provided on the first wick structure among a plurality of the protruding parts in the inner surface of the first surface.

{11} The vapor chamber according to any one of {7} to {10}, wherein the first wick structure is a sintered body of powder, and the second wick structure is a sintered body of powder.

{12} The vapor chamber according to {11}, wherein an average primary particle size of a first powder that is a raw material of the first wick structure is smaller than an average primary particle size of a second powder that is a raw material of the second wick structure.

{13} The vapor chamber according to any one of {1} to {12}, wherein the container inner surface area increasing unit is plate-shaped fins, pin fins and/or recesses.

{14} The vapor chamber according to any one of {1} to {13}, wherein the entire first surface is a planar part, and the container inner surface area increasing unit is formed on an inner surface of the planar part.

{15} The vapor chamber according to any one of {1} to {13}, wherein the first surface includes a planar part, and a projection part projected in an outward direction from the planar part, whereby the container includes a planar portion and a projection portion projected in an outward direction from the planar portion, and the container inner surface area increasing unit is formed on an inner surface of the projection portion.

{16} The vapor chamber according to any one of {1} to {15}, wherein a third wick structure is provided outside of the container inner surface area increasing unit, on the first surface, and the third wick structure is connected to the first wick structure.

{17} The vapor chamber according to any one of {1} to {16}, wherein a block-shaped wick member is further provided between the first wick structure and the second surface.

According to an aspect of the vapor chamber of the present disclosure, on the inner surface of the first surface of the container, the container inner surface area increasing unit having the protruding part is formed, and the first wick structure is provided on the surface of the protruding part, whereby an evaporation surface area for the working fluid in a liquid phase is increased to reduce thermal resistance at the time of the working fluid in a liquid phase changing in phase to a gas phase, and the working fluid in a liquid phase stays in the container inner surface area increasing unit to be able to prevent dry-out of the working fluid in a liquid phase in the evaporation unit, so that it is possible to exhibit excellent heat transport properties.

According to an aspect of the vapor chamber of the present disclosure, the surface of the protruding part is covered with the first wick structure, and thereby the working fluid in a liquid phase can stay throughout the entire container inner surface area increasing unit, so that it is possible to prevent dry-out of the working fluid in a liquid phase more reliably while more reliably reducing the thermal resistance at the time of the working fluid in a liquid phase changing in phase to a gas phase.

According to an aspect of the vapor chamber of the present disclosure, the second wick structure having a smaller capillary force than the first wick structure is further provided on the first wick structure provided on the surface of the protruding part, whereby retention characteristics of the working fluid in a liquid phase in the container inner surface area increasing portion and reflux characteristics to the container inner surface area increasing unit are improved in a well-balanced manner.

According to an aspect of the vapor chamber of the present disclosure, the second wick structure contacts the inner surface of the second surface of the container, whereby the working fluid in a liquid phase not only can flow back to the container inner surface area increasing unit along the first surface but also can flow back to the container inner surface area increasing unit along the second surface, so that flow path resistance of the working fluid in a liquid phase reduces, and the reflux characteristics of the working fluid in a liquid phase to the container inner surface area increasing unit are further improved.

According to an aspect of the vapor chamber of the present disclosure, the second wick structure is further provided on the first wick structure extending to the spaces among a plurality of protruding parts, whereby the retention characteristics of the working fluid in a liquid phase in the container inner surface area increasing unit by the first wick structure and the reflux characteristics to the container inner surface area increasing unit by the second wick structure are further improved in a well-balanced manner.

According to an aspect of the vapor chamber of the present disclosure, the average primary particle size of the first powder that is the raw material of the first wick structure that is the sintered body of powder is smaller than the average primary particle size of the second powder that is the raw material of the second wick structure that is the sintered body of powder, and thereby the first wick structure having a large capillary force and the second wick structure having a small capillary force are easily formed.

According to an aspect of the vapor chamber of the present disclosure, the third wick structure is provided outside of the container inner surface area increasing unit on the first surface, and the third wick structure is connected to the first wick structure, and thereby the reflux characteristics of the working fluid in a liquid phase to the container inner surface area increasing unit from outside of the container inner surface area increasing unit are further improved.

DETAILED DESCRIPTION

Figure 1:
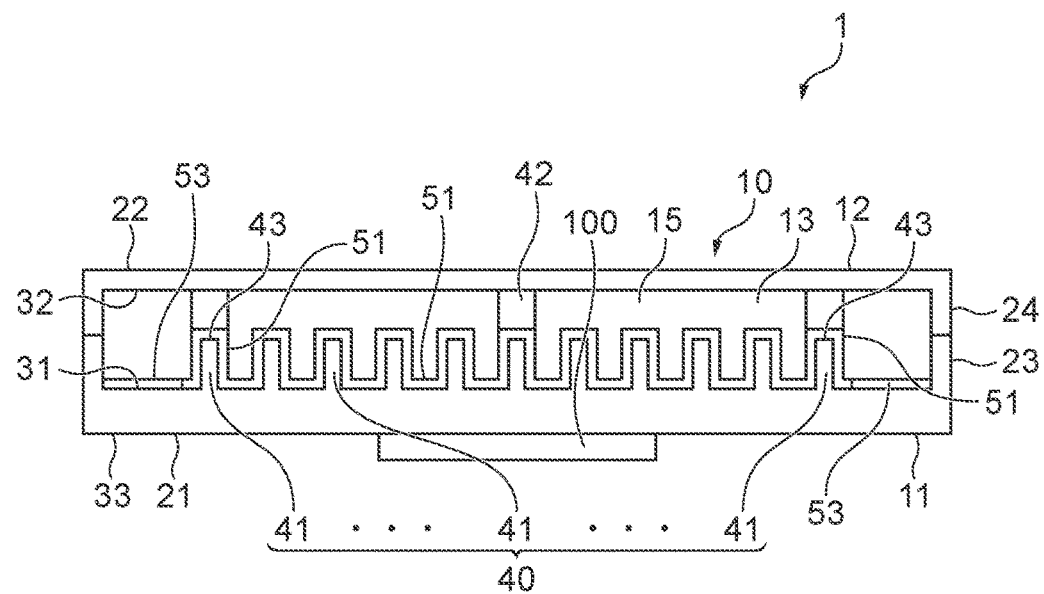
FIG. 1 is a sectional front view explaining an outline of an internal structure of a vapor chamber according to a first embodiment example of the present disclosure.
Figure 2:
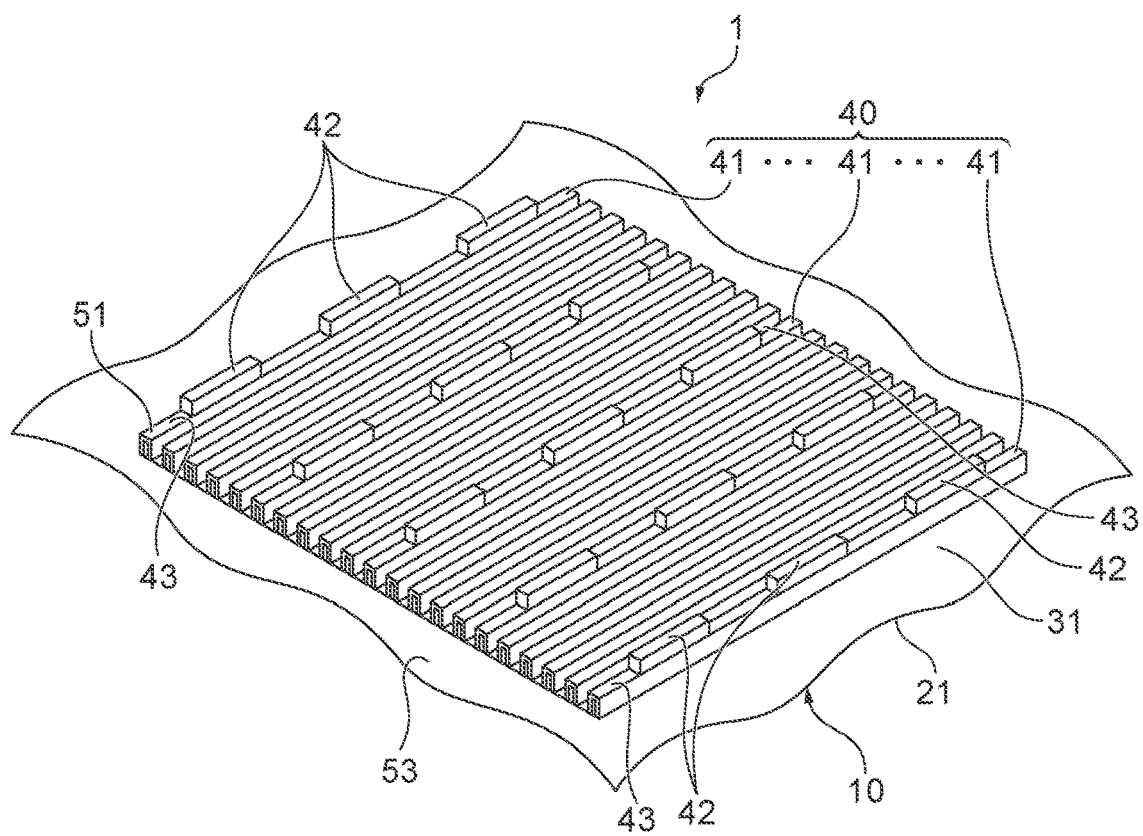
FIG. 2 is a perspective view explaining the outline of the internal structure of the vapor chamber according to the first embodiment example of the present disclosure.
Figure 3:
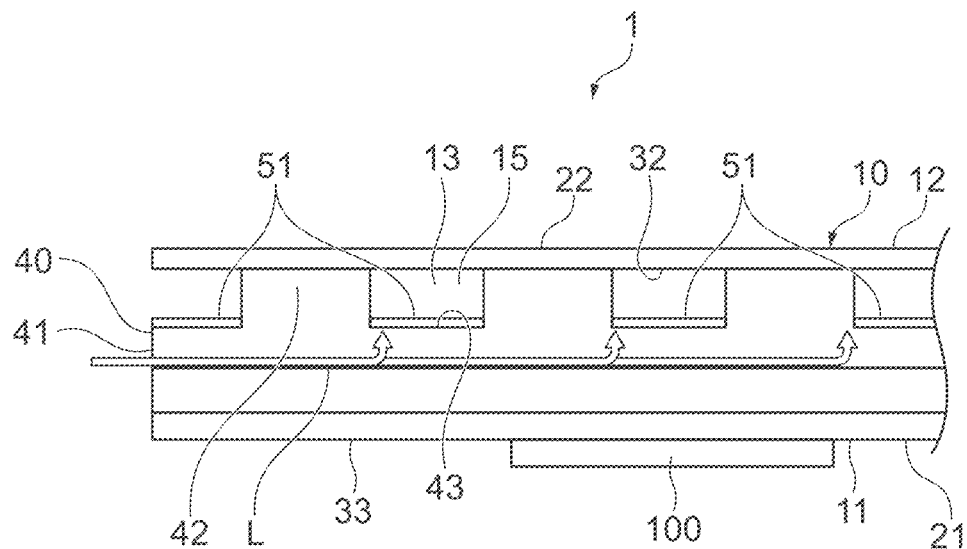
FIG. 3 is a sectional side view explaining the outline of the internal structure of the vapor chamber according to the first embodiment example of the present disclosure.

Hereinafter, a vapor chamber according to a first embodiment example of the present disclosure will be described in detail. FIG. 1 is a sectional front view explaining an outline of an internal structure of a vapor chamber according to the first embodiment example of the present disclosure. FIG. 2 is a perspective view explaining the outline of the internal structure of the vapor chamber according to the first embodiment example of the present disclosure. FIG. 3 is a sectional side view explaining the outline of the internal structure of the vapor chamber according to the first embodiment example of the present disclosure.

As shown in FIG. 1, a vapor chamber 1 according to the first embodiment example of the present disclosure includes a container 10 in which a cavity portion 13 is formed inside by overlapping two plate-shaped bodies opposing each other, that is, one plate-shaped body 11 and another plate-shaped body 12 opposing the one plate-shaped body 11, a working fluid (not illustrated) sealed in the cavity portion 13, a vapor flow path 15 through which the working fluid in a gas phase flows, the vapor flow path 15 being provided in the cavity portion 13.

The container 10 is a thin plate-shaped container, the one plate-shaped body 11 has a first surface 21 that is a first main surface, and the other plate-shaped body 12 has a second surface 22 that is a second main surface. Accordingly, the container 10 has the first surface 21 that is the first main surface, and the second surface 22 that is the second main surface and opposes the first surface 21.

Further, on the one plate-shaped body 11, a side wall 23 is provided to be erected along a periphery of the first surface 21, and on the other plate-shaped body 12, a side wall 24 is provided to be erected along a periphery of the second surface 22. The cavity portion 13 that is an internal space of the container 10 is formed by causing a tip end of the side wall 23 of the one plate-shaped body 11 and a tip end of the side wall 24 of the other plate-shaped body 12 to be disposed to oppose each other and abut on each other. Accordingly, a side surface of the container 10 is formed by the side wall 23 and the side wall 24. The cavity portion 13 is a hermetically closed space and is decompressed by degassing. The entire internal space of the container 10 is in communication, and the working fluid can flow through the entire internal space of the container 10.

A shape of the container 10 is not particularly limited, and in the vapor chamber 1, for example, a polygonal shape such as a quadrangular shape, a circular shape, an elliptical shape, a shape having straight line portions and curving portions and the like are cited in a plan view (the state viewed from the direction perpendicular to the main surface of the container 10).

As shown in FIG. 1, on an inner surface 31 of the first surface 21, a container inner surface area increasing unit 40 that is a part that increases a surface area of the inner surface 31 of the container 10 is formed. The container inner surface area increasing unit 40 is provided in a partial region of the inner surface 31 of the first surface 21. A position at which the container inner surface area increasing unit 40 is provided is not particularly limited, and can be appropriately selected according to use conditions and the like of the vapor chamber 1. In the vapor chamber 1, the container inner surface area increasing unit 40 is disposed in a center portion of the first surface 21. In the vapor chamber 1, the entire first surface 21 is a flat planar part, and the container inner surface area increasing unit 40 is formed on an inner surface of the planar part.

The container inner surface area increasing unit 40 is a part having a plurality of protruding parts 41, 41, 41 . . . that protrude in a second surface 22 direction from the inner surface 31 of the first surface 21. The plurality of protruding parts 41, 41, 41 . . . are disposed at predetermined intervals. A surface area of the inner surface 31 of the first surface 21 is in a mode of being increased by the plurality of protruding parts 41, 41, 41 . . . . Note that in the vapor chamber 1, a container inner surface area increasing unit is not formed on an inner surface 32 of the second surface 22.

A heating element 100 to be cooled is thermally connected to an outer surface 33 of the first surface 21. Specifically, the heating element 100 is thermally connected to a part corresponding to the position of the container inner surface area increasing unit 40, in the outer surface 33 of the first surface 21. Accordingly, in the outer surface 33 of the first surface 21, a part corresponding to the position of the container inner surface area increasing unit 40 functions as an evaporation unit (heat receiving unit) of the vapor chamber 1. From the above, by the container inner surface area increasing unit 40, a contact area of the working fluid in a liquid phase that flows back to the evaporation unit and the inner surface 31 of the first surface 21 increases. In other words, by the container inner surface area increasing unit 40, an evaporation surface area of the working fluid in a liquid phase is increased, and heat transfer from the heating element 100 to the working fluid in a liquid phase via the container 10 is facilitated. As a result, phase change of the working fluid in a liquid phase to a gas phase is promoted.

A ratio of a height of the protruding part 41 (that is, a dimension in a protruding direction of the protruding part 41) to a thickness of the protruding part 41 is not particularly limited, but is preferably 1.0 or more and 3.0 or less from a viewpoint of sufficiently securing the surface area of the container inner surface area increasing unit 40, and viewpoints of easiness of producing the container inner surface area increasing unit 40 and easiness of forming a first wick structure 51 described later. Note that the ratio of the height of the protruding part 41 to the thickness of the protruding part 41 is a ratio that does not include the first wick structure 51 provided on a surface of the protruding part 41 described later.

Distances among the protruding parts 41 in the container inner surface area increasing unit 40 having the plurality of protruding parts 41, 41, 41 . . . is not particularly limited, but the protruding parts 41 are preferably provided to be separated from the other protruding parts 41 by 0.4 mm or more, from a viewpoint of sufficiently securing the vapor flow path 15 to facilitate flow of the working fluid in a gas phase, and the viewpoint of easiness of forming the first wick structure 51 described later As shown in FIG. 1, the first wick structure 51 having a capillary force is provided on the surface of the protruding part 41. In the vapor chamber 1, a layer of the first wick structure 51 is formed on the surface of the protruding part 41. Specifically, the entire surface of the protruding part 41 including a tip end 43 of the protruding part 41 and side portions of the protruding part 41 is covered with the first wick structure 51. Further, in each of the plurality of protruding parts 41, 41, 41 . . . , the entire surface including the tip end 43 and the side portions is covered with the first wick structure 51. The working fluid in a liquid phase is retained by the protruding part 41 by the capillary force of the first wick structure 51, and as a result, can stay in the container inner surface area increasing unit 40.

Note that the first wick structure 51 does not contact the inner surface 32 of the second surface 22. In other words, the first wick structure 51 is exposed to the vapor flow path 15. Accordingly, a space between the first wick structure 51 and the inner surface 32 of the second surface 22 is a space portion, and is the vapor flow path 15 through which the working fluid in a gas phase flows. From the above, in the vapor chamber 1, the vapor flow path 15 is reliably secured.

The first wick structure 51 extends from the surface of the protruding part 41 to the inner surface 31 of the first surface 21 among the plurality of protruding parts 41, 41, 41 . . . . Accordingly, in the inner surface 31 of the first surface 21, parts among the plurality of protruding parts 41, 41, 41 . . . are covered with the first wick structure 51. The first wick structure 51 among the plurality of protruding parts 41, 41, 41 . . . is in a layer form, and a layer of the first wick structure 51 is formed between a base portion of the protruding part 41 and a base portion of the protruding part 41. From the above, the container inner surface area increasing unit 40 is covered with the first wick structure 51.

A thickness of the first wick structure 51 is not particularly limited, but the thickness of the first wick structure 51 is preferably 0.1 mm or more and 1.0 mm or less, from a viewpoint of reliably preventing dry-out of the vapor chamber 1 by causing the working fluid in a liquid phase to sufficiently stay in the container inner surface area increasing unit 40, and a viewpoint of reliably reducing thermal resistance at a time of the working fluid in a liquid phase changing in phase to a gas phase, and giving excellent thermal conductivity to the container inner surface area increasing unit 40.

As the protruding part 41 forming the container inner surface area increasing unit 40, a plate-shaped fin provided to be elected on the inner surface 31 of the first surface 21, and a pin fin (pillar pin) are cited, for example. Further, as the protruding part 41, a protruding part that is obtained by forming recesses in the inner surface 31 of the first surface 21 is cited. The container inner surface area increasing unit 40 can be provided by molding the container 10 by using a die, and attaching a separate member from the container 10 to the inner surface 31 of the first surface 21, for example. As a method for forming the plate-shaped fin, and the pin fin, a method of attaching a plate-shaped fin, or a pin fin separately produced to the inner surface 31 of the first surface 21 by soldering, brazing, sintering or the like, a method of cutting the inner surface 31 of the first surface 21, a method of extruding, a method of etching and the like are cited, for example. Further, as a method for forming a recess, a method of cutting the inner surface 31 of the first surface 21, a method of extruding, a method of etching and the like are cited, for example.

As shown in FIGS. 2 and 3, in the vapor chamber 1, as the plurality of protruding parts 41, 41, 41 . . . that form the container inner surface area increasing unit 40, a plurality of plate-shaped fins are disposed in parallel on the inner surface 31 of the first surface 21 at predetermined intervals. In the vapor chamber 1, a shape of each of the plate-shaped fins is a quadrangle shape in front view, and a quadrangle shape in side view.

Further, projection parts 42 that project to the inner surface 32 of the second surface 22 from the tip ends 43 of the protruding parts 41 are provided at some protruding parts 41, of the plurality of protruding parts 41, 41, 41 . . . . The projection parts 42 are molded integrally with the protruding part 41, for example. The projection parts 42 are provided in partial regions in a longitudinal direction of the protruding part 41. A tip end of the projection part 42 abuts on the inner surface 32 of the second surface 22. The projection part 42 functions as a support member that maintains the cavity portion 13 that is decompressed by abutting on the second surface 22.

As shown in FIGS. 1 and 2, in the vapor chamber 1, a third wick structure 53 having a capillary force is provided outside of the container inner surface area increasing unit 40 on the first surface 21. In other words, in the inner surface 31 of the first surface 21, in a part where the container inner surface area increasing unit 40 is formed, the first wick structure 51 is provided, and in a part where the container inner surface area increasing unit 40 is not formed, the third wick structure 53 is provided. The third wick structure 53 has a smaller capillary force than the first wick structure 51, and functions as a wick structure having small flow path resistance and excellent in flowability of the working fluid in a liquid phase. The third wick structure 53 is formed on the inner surface 31 of the first surface 21, in a laminar form. In the vapor chamber 1, a region of the inner surface 31 of the first surface 21 where the container inner surface area increasing unit 40 is not formed is covered with the third wick structure 53. The third wick structure 53 is connected to the first wick structure 51.

The working fluid that changes in phase from a gas phase to a liquid phase in a condensing unit (radiating unit) of the vapor chamber 1 flows back in a direction of the first wick structure 51 located in the evaporation unit from a condensing unit direction in an inside of the third wick structure 53, and further flows back to the first wick structure 51 connected to the third wick structure 53 from the third wick structure 53, by the capillary force of the third wick structure 53. Accordingly, since the third wick structure 53 is provided outside of the container inner surface area increasing unit 40 on the first surface 21, the working fluid that diffuses inside of the container 10 can smoothly flow back to the first wick structure 51 located in the evaporation unit.

As shown in FIGS. 1 to 3, the vapor flow path 15 is an internal space of the container 10, and extends throughout the entire container 10. Accordingly, the working fluid in a gas phase can flow throughout the entire container 10 by the vapor flow path 15.

Materials of the container inner surface area increasing unit 40 and the projection part 42 are not particularly limited, and it is possible to cite, thermally conductive members, for example. As a specific example of the material of the container inner surface area increasing unit 40, it is possible to cite metal members (for example, a copper, copper alloy, aluminum, aluminum alloy, stainless steel and the like), a carbon member (for example, graphite and the like).

As the first wick structure 51, it is possible to cite a sintered body of powder such as metal powder, metal fiber, metal mesh, metal braid and the like. These materials may be used alone or two kinds or more of these materials may be used in combination. Of these materials, a sintered body of powder such as metal powder is preferable from a viewpoint of easiness of covering a surface of the protruding part 41, that is, of being able to easily form a layer of the first wick structure 51 having a desired thickness on the surface of the protruding part 41. As the sintered body of powder, it is possible to cite a sintered body of metal powder such as copper powder, or stainless steel powder, sintered body of mixture powder of metal powder such as copper powder and carbon powder, and the like. An average primary particle size of a first powder that is a raw material of the sintered body of powder can be appropriately selected according to a capillary force required of the first wick structure 51, reflux characteristics of the working fluid in a liquid phase and the like, and is preferably 30 µm or more and 150 µm or less, and particularly preferably 50 µm or more and 100 µm or less, from a viewpoint of improving retention characteristics of the working fluid in a liquid phase in the container inner surface area increasing unit 40, for example.

As the third wick structure 53, it is possible to cite a sintered body of powder such as metal powder, metal fiber, metal mesh, metal braid and the like. These materials may be used alone, or two kinds or more of these materials may be used in combination. Of these materials, a sintered body of powder such as metal powder is preferable, from a viewpoint of being able to easily form the layer of the third wick structure 53 having a desired thickness. As the sintered body of powder, it is possible to cite a sintered body of metal powder such as copper powder or stainless steel powder, a sintered body of mixture powder of metal powder such as copper powder and carbon powder, and the like. An average primary particle size of a third powder that is a raw material of the sintered body of powder can be appropriately selected according to a capillary force required of the third wick structure 53, reflux characteristics of the working fluid in a liquid phase, and the like, and is preferably 160 µm or more and 400 µm or less, and is particularly preferably 200 µm or more and 350 µm or less, from a view point of reliably reducing the flow path resistance of the working fluid in a liquid phase while having a predetermined capillary force, for example.

The material of the container 10 is not particularly limited, and it is possible to cite a copper and copper alloy from a viewpoint of being excellent in thermal conductivity, an aluminum and aluminum alloy from a viewpoint of light weight, and metal such as stainless steel from a viewpoint of improvement of mechanical strength, for example. The material of the container 10 may be the same material as or may be a different material from the container inner surface area increasing unit 40. Further, in accordance with a use situation of the vapor chamber 1, a tin, tin alloy, titanium, titanium alloy, nickel, nickel alloy and the like may be used as the material of the container 10.

Further, the working fluid to be sealed in the container 10 can be appropriately selected according to the material of the container 10, and it is possible to cite, for example, water, a CFC substitute, perfluorocarbon, cyclopentane, and the like.

Next, a mechanism of a cooling function of the vapor chamber 1 will be described with use of FIGS. 1 to 3. First, the heating element 100 that is an element to be cooled is thermally connected to the part corresponding to the container inner surface area increasing unit 40, in the outer surface 33 of the first surface 21 of the container 10. When the container 10 receives heat from the heating element 100 in the part corresponding to the container inner surface area increasing unit 40, heat is transferred from the heating element 100 to the working fluid in a liquid phase that stays in the first wick structure 51 in the part corresponding to the container inner surface area increasing unit 40 of the container 10, and the working fluid in a liquid phase changes in phase to the working fluid in a gas phase. The working fluid in a gas phase flows through the vapor flow path 15 in an outward direction of the container inner surface area increasing unit 40 from the container inner surface area increasing unit 40, and diffuses throughout the entire container 10. Since the working fluid in a gas phase diffuses throughout the entire container 10 from the container inner surface area increasing unit 40, the container 10 transports the heat from the heating element 100 to the entire container 10 from the container inner surface area increasing unit 40, and the heat from the heating element 100 diffuses in the entire container 10. The working fluid in a gas phase that can flow throughout the entire container 10 releases latent heat by a heat exchanging unit (not illustrated) such as a heat dissipation fin that is thermally connected to the outer surface of the container 10, and changes in phase from the gas phase to a liquid phase. The latent heat that is released to an external environment of the vapor chamber 1 via the heat exchanging unit thermally connected to the container 10. A working fluid L that changes in phase from the gas phase to a liquid phase by releasing the latent heat flows back inside of the third wick structure 53 to a direction of the first wick structure 51 by the capillary force of the third wick structure 53 provided on the first surface 21, and further flows back to the first wick structure 51 connected to the third wick structure 53 from the third wick structure 53. In other words, the working fluid L in a liquid phase flows back to a heat receiving unit where the container inner surface area increasing unit 40 is provided from a heat dissipation unit of the vapor chamber 1.

In the vapor chamber 1 according to the first embodiment example of the present disclosure, the container inner surface area increasing unit 40 having the protruding parts 41 is formed on the inner surface 31 of the first surface 21 of the container 10, whereby the evaporation surface area for the working fluid in a liquid phase is increased, and the thermal resistance at a time of the working fluid in a liquid phase changing in phase to a gas phase is reduced. Further, since the first wick structure 51 is provided on the surfaces of the protruding parts 41, the working fluid in a liquid phase stays in the container inner surface area increasing unit and can prevent dry-out of the working fluid in a liquid phase in the evaporation unit. Accordingly, in the vapor chamber 1, phase change of the working fluid is facilitated, and therefore, it is possible to exhibit excellent heat transport properties even when the heating element 100 having a high heat generation amount is thermally connected.

Further, since in the vapor chamber 1, the working fluid in a liquid phase can stay throughout the entire container inner surface area increasing unit 40 because the surface of the container inner surface area increasing unit 40 is covered with the first wick structure 51, so that it is possible to prevent dry-out of the working fluid in a liquid phase more reliably while more reliably reducing the thermal resistance at the time of the working fluid in a liquid phase changing in phase to a gas phase.

Further, in the vapor chamber 1, the third wick structure 53 is provided around the container inner surface area increasing unit 40, and the third wick structure 53 is connected to the first wick structure 51, whereby the reflux characteristics from outside of the container inner surface area increasing unit 40 to the container inner surface area increasing unit 40 are further improved. Accordingly, it is possible to more reliably prevent dry-out of the working fluid in a liquid phase in the container inner surface area increasing unit 40, in the vapor chamber 1.

Figure 4:
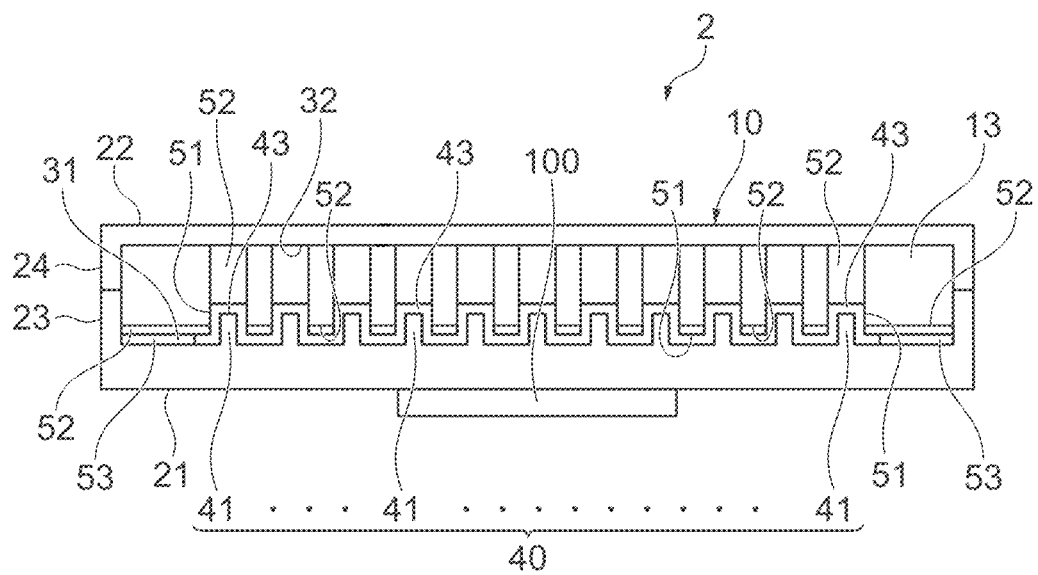
FIG. 4 is a sectional front view explaining an outline of an internal structure of a vapor chamber according to a second embodiment example of the present disclosure.
Figure 5:
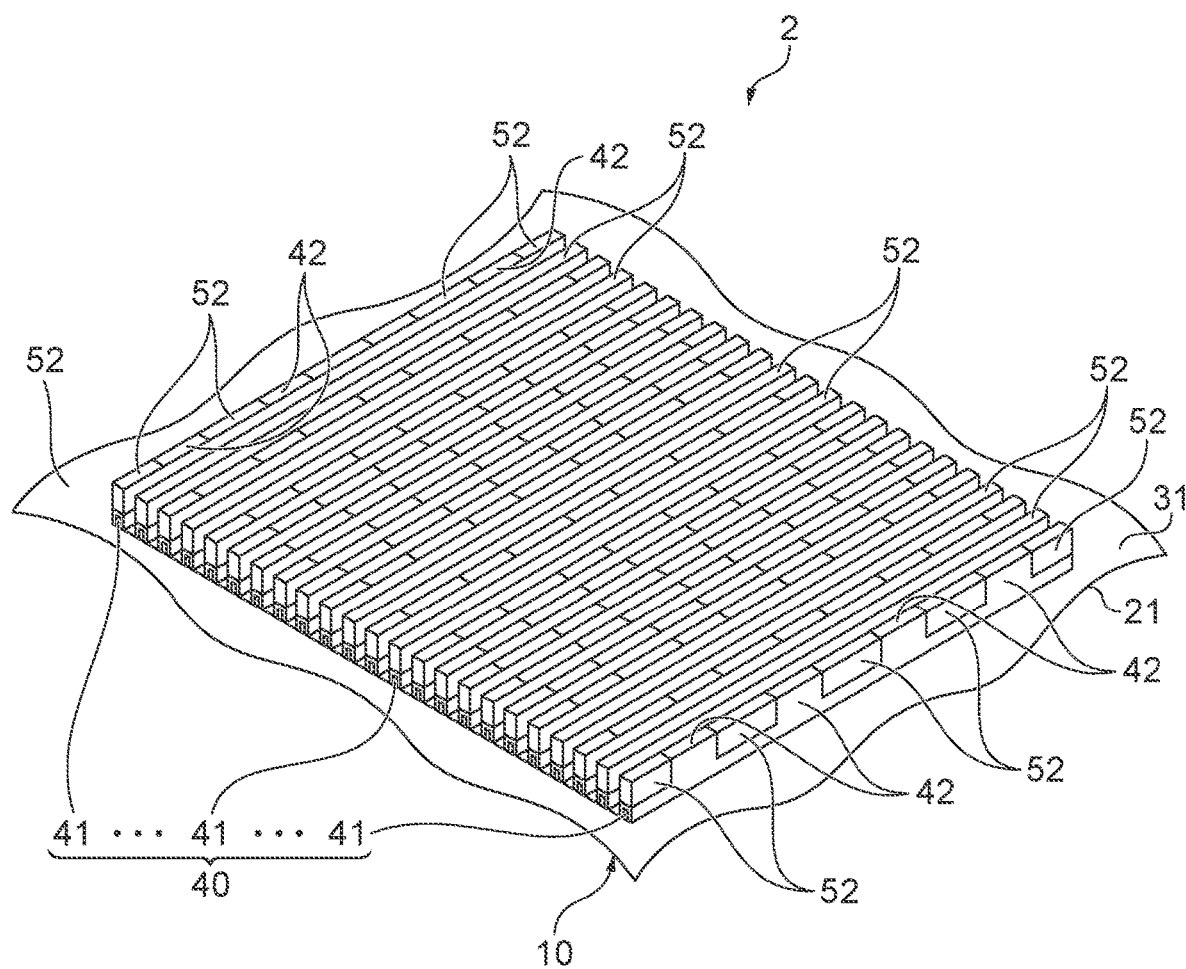
FIG. 5 is a perspective view explaining the outline of the internal structure of the vapor chamber according to the second embodiment example of the present disclosure.
Figure 6:
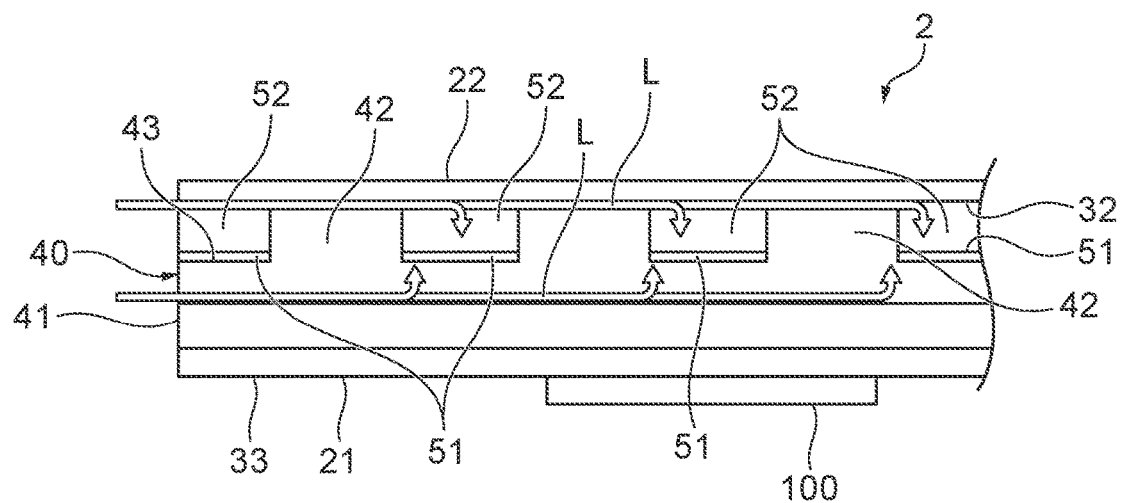
FIG. 6 is a sectional side view explaining the outline of the internal structure of the vapor chamber according to the second embodiment example of the present disclosure.

Next, details of a vapor chamber according to a second embodiment example of the present disclosure will be described. FIG. 4 is a sectional front view explaining an outline of an internal structure of the vapor chamber according to the second embodiment example of the present disclosure. FIG. 5 is a perspective view explaining the outline of the internal structure of the vapor chamber according to the second embodiment example of the present disclosure. FIG. 6 is a sectional side view explaining the outline of the internal structure of the vapor chamber according to the second embodiment example of the present disclosure. Note that in the vapor chamber according to the second embodiment example, main components are common to those in the vapor chamber according to the first embodiment example, and therefore, the same components as those of the vapor chamber according to the first embodiment example will be described by using the same reference signs.

In the vapor chamber 1 according to the first embodiment example, the entire surface of the protruding part 41 is covered with the first wick structure 51, but as shown in FIGS. 4 to 6, in a vapor chamber 2 according to the second embodiment example, a second wick structure 52 different from the first wick structure 51 is further provided on a tip end 43 of the protruding part 41. In the vapor chamber 2, the second wick structure 52 has a smaller capillary force than the first wick structure 51. The second wick structure 52 is formed on the first wick structure 51 provided on a surface of the protruding part 41. The second wick structure 52 is provided on each of a plurality of protruding parts 41, 41, 41 . . . . Accordingly, in a container inner surface area increasing unit 40 of the vapor chamber 2, the tip end 43 of the protruding part 41 has a laminated structure of wick structures having the first wick structure 51 and the second wick structure 52. Note that in the vapor chamber 2, an entire first surface 21 is also a flat planar part, and the container inner surface area increasing unit 40 is also formed on an inner surface of the planar part.

An entire surface of the protruding part 41 including the tip end 43 of the protruding part 41 and side portions of the protruding part 41 may be covered with the second wick structure 52, or the side portions of the protruding part 41 may not be covered with the second wick structure 52. The vapor chamber 2 has a mode in which the tip end 43 of the protruding part 41 is covered with the second wick structure 52 and the side portions of the protruding part 41 are not covered with the second wick structure 52.

The second wick structure 52 extends in an inner surface 32 direction of a second surface 22 from the tip end 43 of the protruding part 41, and contacts an inner surface 32 of the second surface 22. From the above, the container inner surface area increasing unit 40 connects to the inner surface 32 of the second surface 22 via the second wick structure 52. Accordingly, as shown in FIG. 6, a working fluid L in a liquid phase not only can flow back to the container inner surface area increasing unit 40 along the first surface 21 but also can flow back to the container inner surface area increasing unit 40 along the second surface 22.

Further, as shown in FIG. 4, the second wick structure 52 is also provided on the first wick structure 51 provided among the plurality of protruding parts 41, 41, 41 . . . in the inner surface 31 of the first surface 21. The second wick structure 52 provided among the plurality of protruding parts 41, 41, 41 . . . is layered, and a layer of the second wick structure 52 is formed between a base portion of the protruding part 41 and a base portion of the protruding part 41. Accordingly, between the base portion of the protruding part 41 and the base portion of the protruding part 41, a laminated structure of wick structures having a layer of the first wick structure 51 and the layer of the second wick structure 52 is formed.

The second wick structure 52 has a smaller capillary force than the first wick structure 51, and therefore functions as a wick structure having small flow path resistance and excellent in flowability of the working fluid in a liquid phase. Accordingly, the second wick structure 52 is further provided on the first wick structure 51 that extends to among the plurality of protruding parts 41, 41, 41 . . . , retention characteristics of the working fluid in a liquid phase in the container inner surface area increasing unit 40 by the first wick structure 51 and reflux characteristics to the container inner surface area increasing unit 40 by the second wick structure 52 are further improved in a well-balanced manner.

Further, as shown in FIG. 4, the second wick structure 52 is also provided on the third wick structure 53 provided outside of the container inner surface area increasing unit 40 of the first surface 21. The second wick structure 52 is formed to be layered on the third wick structure 53. Accordingly, a laminated structure of wick structures having a layer of the third wick structure 53 and a layer of the second wick structure 52 is formed outside of the container inner surface area increasing unit 40 on the first surface 21. The second wick structure 52 has a smaller capillary force than the first wick structure 51 like the third wick structure 53, and therefore, functions as a wick structure having small flow path resistance, and excellent in flowability of the working fluid in a liquid phase.

As the second wick structure 52, it is possible to cite a sintered body of powder such as metal powder, metal fiber, metal mesh, metal braid and the like. These materials may be used alone, or two kinds or more of these materials may be used in combination. Of these materials, a sintered body of powder such as metal powder is preferable, from a viewpoint of being able to easily form the layer of the second wick structure 52 having a desired thickness. As the sintered body of powder, it is possible to cite a sintered body of metal powder such as copper powder or stainless steel powder, a sintered body of mixture powder of metal powder such as copper powder and carbon powder, and the like. An average primary particle size of a second powder that is a raw material of the sintered body of powder can be appropriately selected according to a capillary force required of the second wick structure 52, reflux characteristics of the working fluid in a liquid phase and the like, and is preferably 160 μm or more and 400 μm or less, and is particularly preferably 200 μm or more and 350 μm or less, from a viewpoint of reliably reducing the flow path resistance of the working fluid in a liquid phase while having a predetermined capillary force, for example. From the above, the average primary particle size of the first powder that is the raw material of the first wick structure 51 is preferably smaller than the average primary particle size of the second powder that is a raw material of the second wick structure 52, from a viewpoint of being able to easily form the first wick structure 51 having a large capillary force and the second wick structure 52 having a small capillary force.

Since the container inner surface area increasing unit 40 having the protruding parts 41 is also formed on the inner surface 31 of the first surface 21 of the container 10 in the vapor chamber 2, the evaporation surface area for the working fluid in a liquid phase is increased to reduce thermal resistance at the time of the working fluid in a liquid phase changing in phase to a gas phase. Since the first wick structure 51 is provided on the surface of the protruding part 41, the working fluid in a liquid phase stays in the container inner surface area increasing unit and can prevent dry-out of the working fluid in a liquid phase in an evaporation unit. Further, since the second wick structure 52 having a smaller capillary force than the first wick structure 51 is provided on the wick structure 51 provided on the surface of the protruding part 41, in the vapor chamber 2, the retention characteristics of the working fluid in a liquid phase in the container inner surface area increasing unit 40 and the reflux characteristics to the container inner surface area increasing unit 40 are improved in a well-balanced manner.

In particular, in the vapor chamber 2, as shown in FIG. 6, the second wick structure 52 contacts the inner surface 32 of the second surface 22, whereby the working fluid L in a liquid phase not only can flow back to the container inner surface area increasing unit 40 along the first surface 21, but also can flow back to the container inner surface area increasing unit 40 along the second surface 22, so that the flow path resistance of the working fluid L in a liquid phase is reduced, and the reflux characteristics of the working fluid L in a liquid phase to the container inner surface area increasing unit 40 are further improved.

From the above, in order that the working fluid L in a liquid phase smoothly flows back along the second surface 22, a wick structure (not illustrated) may also be provided along an extending direction of the second surface 22, on the inner surface 32 of the second surface 22, as necessary.

Figure 7:
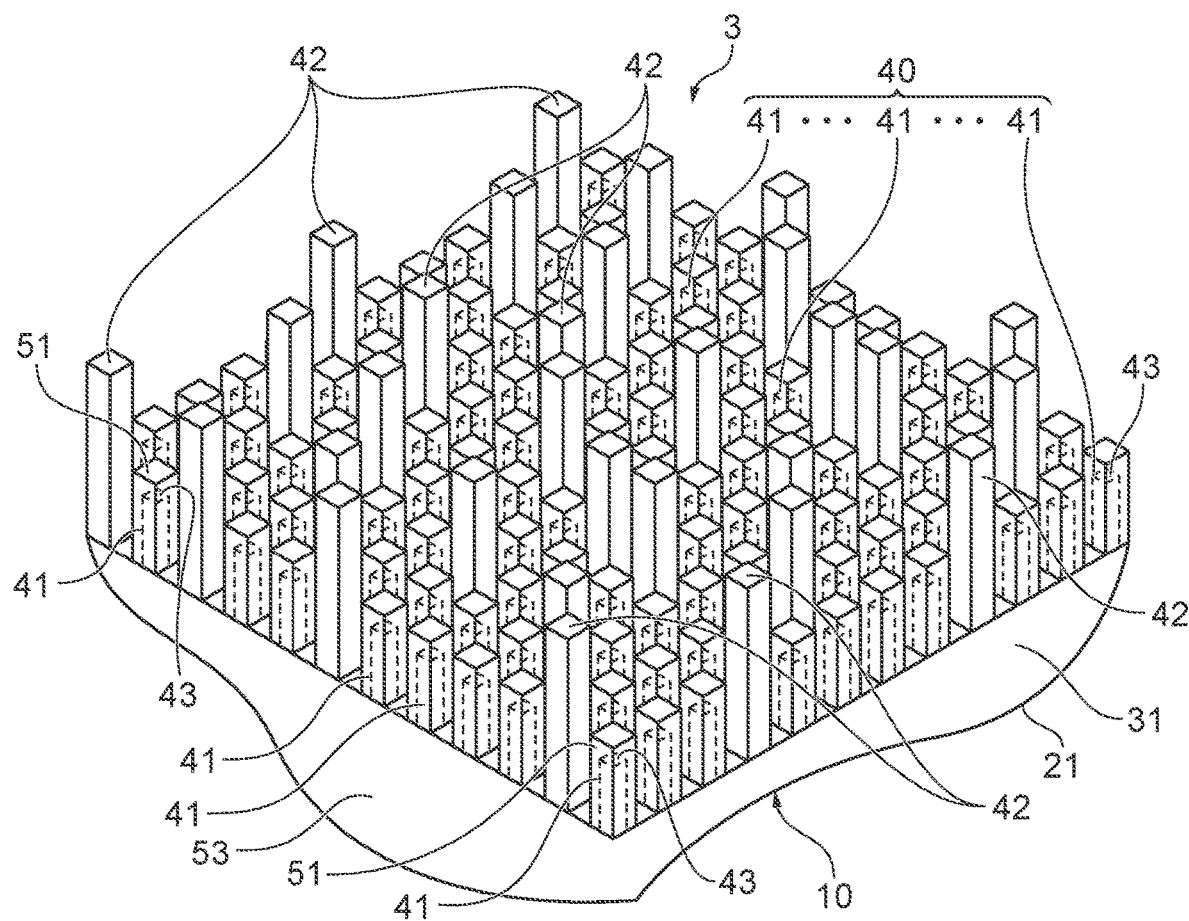
FIG. 7 is a perspective view explaining an outline of an internal structure of a vapor chamber according to a third embodiment example of the present disclosure.

Next, details of a vapor chamber according to a third embodiment example of the present disclosure will be described. FIG. 7 is a sectional front view explaining an outline of an internal structure of the vapor chamber according to the third embodiment example of the present disclosure. Note that in the vapor chamber according to the third embodiment example, main components are common to those in the vapor chambers according to the first and the second embodiment examples, and therefore, the same components as those of the vapor chambers according to the first and the second embodiment examples will be described by using the same reference signs.

In the vapor chamber 1 according to the first embodiment example, a plurality of plate-shaped fins are disposed in parallel on the inner surface 31 of the first surface 21 at the predetermined intervals, as the plurality of protruding parts 41, 41, 41 . . . that form the container inner surface area increasing unit 40, but as shown in FIG. 7, in a vapor chamber 3 according to the third embodiment example, a plurality of pin fins are disposed in parallel on an inner surface 31 of a first surface 21 at predetermined intervals, as a plurality of protruding parts 41, 41, 41 . . . that form a container inner surface area increasing unit 40. In the vapor chamber 3, a shape of each of the pin fins is a quadrangle in front view, and a quadrangle in side view. The pin fin is a pillar-shaped member.

In the vapor chamber 3, the container inner surface area increasing unit 40 formed of the plurality of pin fins is also covered with a first wick structure 51. Further, a second wick structure 52 that is different from the first wick structure 51 may be provided at a tip end 43 of the protruding part 41 that is a pin fin, as necessary. In this case, the second wick structure 52 is formed on the first wick structure 51 that is provided on a surface of the protruding part 41.

In the vapor chamber 3, the container inner surface area increasing unit 40 having the protruding parts 41 is also formed on the inner surface 31 of the first surface 21 of the container 10, whereby an evaporation surface area for a working fluid in a liquid phase is increased to reduce thermal resistance at a time of the working fluid in a liquid phase changing in phase to a gas phase. Further, since the first wick structure 51 is provided on the surface of the protruding part 41, the working fluid in a liquid phase stays in the container inner surface area increasing unit 40 to be able to prevent dry-out of the working fluid in a liquid phase in an evaporation unit.

Figure 8:
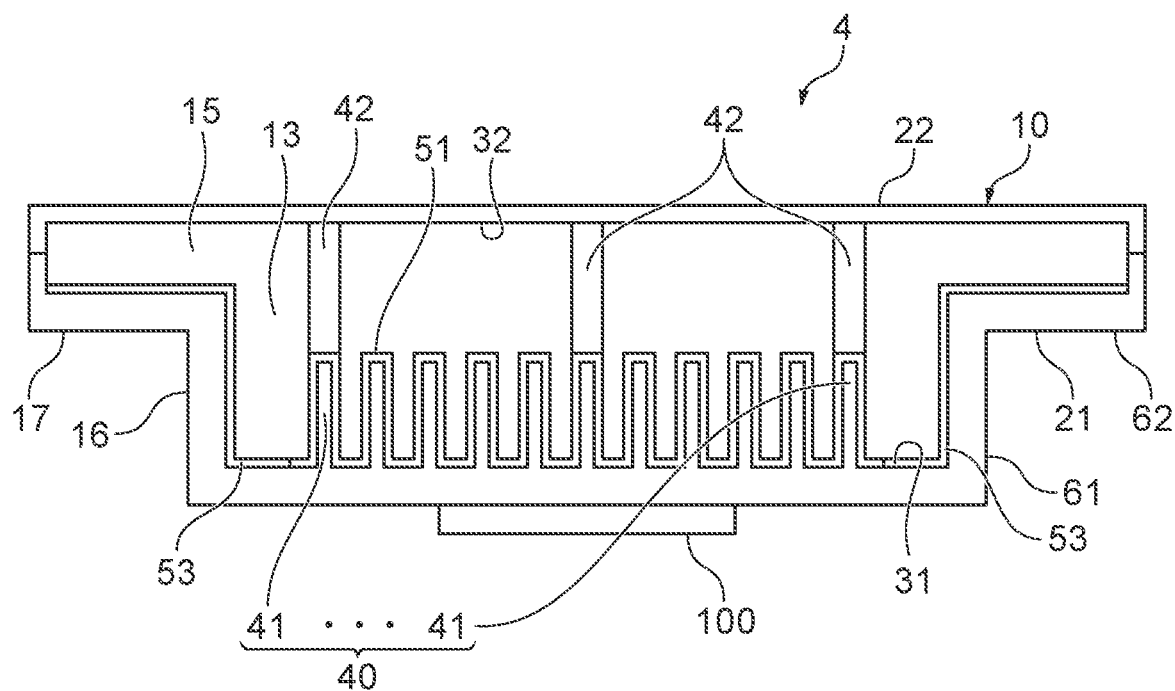
FIG. 8 is a sectional front view explaining an outline of an internal structure of a vapor chamber according to a fourth embodiment example of the present disclosure.

Next, details of a vapor chamber according to a fourth embodiment example of the present disclosure will be described. FIG. 8 is a sectional front view explaining an outline of an internal structure of the vapor chamber according to the fourth embodiment example of the present disclosure. Note that in the vapor chamber according to the fourth embodiment example, main components are common to those in the vapor chambers according to the first to the third embodiment examples, and therefore, the same components as those of the vapor chambers according to the first to the third embodiment examples will be described by using the same reference signs.

In the vapor chamber 1 according to the first embodiment example, the entire first surface 21 is a flat planar part, and the container inner surface area increasing unit 40 is formed on the inner surface of the planar part, but as shown in FIG. 8, in a vapor chamber 4 according to the fourth embodiment example, a container 10 has a planar portion 17 and a projection portion 16 projected in an outward direction from the planar portion 17, and a container inner surface area increasing unit 40 is provided on an inner surface of the projection portion 16. In the vapor chamber 4, the container inner surface area increasing unit 40 is also covered with a first wick structure 51.

In the vapor chamber 4, a first surface 21 has a flat planar part 62 and a projection part 61 that is projected in an outward direction from the planar part 62. Since the first surface 21 has the planar part 62 and the projection part 61 projected in the outward direction from the planar part 62, the container 10 has the planar portion 17 and the projection portion 16 projected in the outward direction from the planar portion 17. An internal space of the projection portion 16 of the container 10 communicates with an internal space of the planar portion 17, and a cavity portion 13 of the container 10 is formed of the internal space of the projection portion 16 and the internal space of the planar portion 17. Accordingly, the working fluid can flow between the internal space of the projection portion 16 and the internal space of the planar portion 17.

A heating element 100 that is an element to be cooled is thermally connected to an outer surface of the projection portion 16 of the container 10, and the projection portion 16 of the container 10 functions as an evaporation unit of the vapor chamber 4. Further, in the vapor chamber 4, projection part 42 projected to an inner surface 32 of a second surface 22 are provided on some protruding parts 41 of a plurality of protruding parts 41, 41, 41 . . . . The projection part 42 is molded integrally with the protruding part 41, for example. The projection part 42 are provided in partial regions in a longitudinal direction of the protruding part 41. A tip end of the projection part 42 abuts on the inner surface 32 of the second surface 22. The projection part 42 abuts on the second surface 22, and thereby functions as a support member that maintains the cavity portion 13 that is decompressed.

In the vapor chamber 4, the container inner surface area increasing unit 40 having the protruding parts 41 is formed on the inner surface 31 of the first surface 21 of the container 10, whereby an evaporation surface area for a working fluid in a liquid phase is increased to reduce thermal resistance at a time of the working fluid in a liquid phase changing in phase to a gas phase. Further, since a first wick structure 51 is provided on surfaces of the protruding parts 41, the working fluid in a liquid phase stays in the container inner surface area increasing unit 40 to be able to prevent dry-out of the working fluid in a liquid phase in an evaporation unit. Further, since the projection portion 16 is provided at the evaporation unit in the vapor chamber 4, it is possible to easily secure an installation space for the container inner surface area increasing unit 40, and it is also possible to further increase a surface area of the evaporation unit on an inner surface of the container 10.

Figure 9:
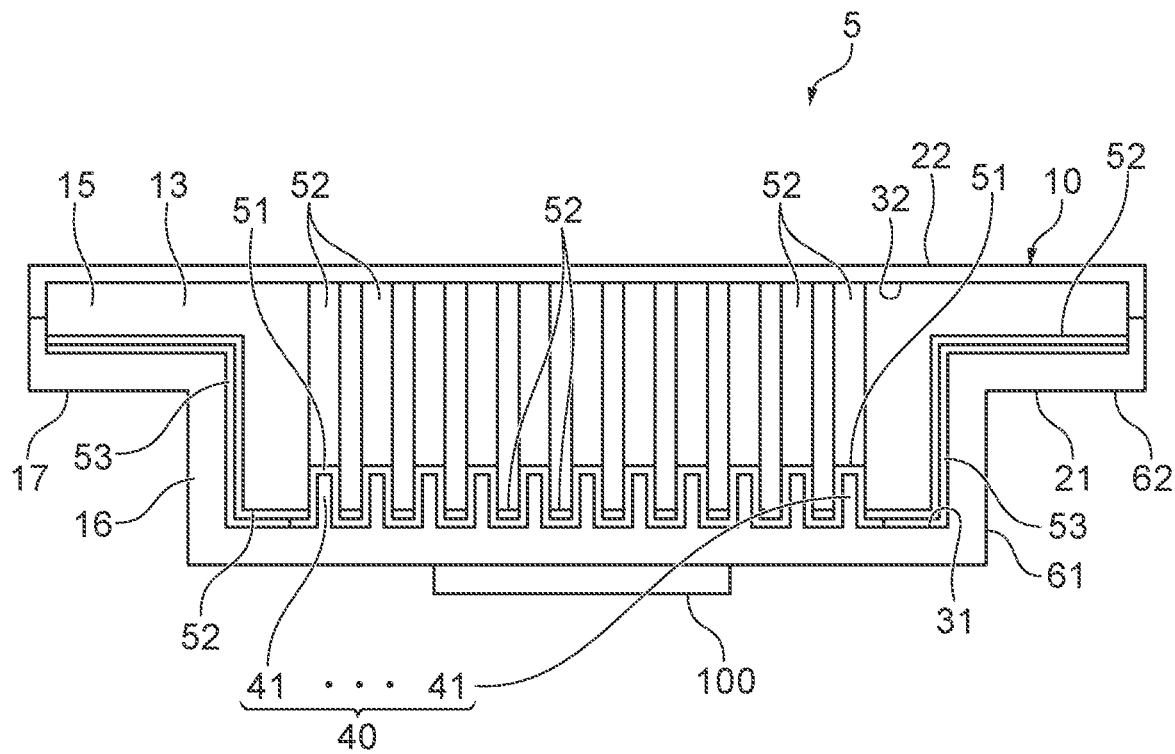
FIG. 9 is a sectional front view explaining an outline of an internal structure of a vapor chamber according to a fifth embodiment example of the present disclosure.

Next, details of a vapor chamber according to a fifth embodiment example of the present disclosure will be described. FIG. 9 is a sectional front view explaining an outline of an internal structure of the vapor chamber according to the fifth embodiment example of the present disclosure. Note that in the vapor chamber according to the fifth embodiment example, main components are common to those in the vapor chambers according to the first to the fourth embodiment examples, and therefore, the same components as those of the vapor chambers according to the first to the fourth embodiment examples will be described by using the same reference signs.

In the vapor chamber 2 according to the second embodiment example, the entire first surface 21 is a flat planar part, and the container inner surface area increasing unit 40 is formed on the inner surface of the planar part, whereas in a vapor chamber 5 according to the fifth embodiment example, as shown in FIG. 9, a container 10 has a planar portion 17 and a projection portion 16 projected in an outward direction from the planar portion 17, and a container inner surface area increasing unit 40 is provided on an inner surface of the projection portion 16. In the vapor chamber 5, the container inner surface area increasing unit 40 is also covered with a first wick structure 51, and a second wick structure 52 is also provided on the first wick structure 51. Further, the second wick structure 52 extends in an inner surface 32 direction of a second surface 22 from the protruding part 41, and contacts an inner surface 32 of the second surface 22.

In the vapor chamber 5, a first surface 21 has a flat planar part 62 and a projection part 61 that is projected in an outward direction from the planar part 62. Since the first surface 21 has the planar part 62 and the projection part 61 projected in the outward direction from the planar part 62, the container 10 has the planar portion 17 and the projection portion 16 projected in the outward direction from the planar portion 17. An internal space of the projection portion 16 of the container 10 communicates with an internal space of the planar portion 17, and a cavity portion 13 of the container 10 is formed of the internal space of the projection portion 16 and the internal space of the planar portion 17. Accordingly, the working fluid can flow between the internal space of the projection portion 16 and the internal space of the planar portion 17.

A heating element 100 that is an element to be cooled is thermally connected to an outer surface of the projection portion 16 of the container 10, and the projection portion 16 of the container 10 functions as an evaporation unit of the vapor chamber 5.

In the vapor chamber 5, the container inner surface area increasing unit 40 having the protruding parts 41 is formed on an inner surface 31 of the first surface 21 of the container 10, whereby an evaporation surface area for a working fluid in a liquid phase is increased to reduce thermal resistance at a time of the working fluid in a liquid phase changing in phase to a gas phase. Further, since the first wick structure 51 is provided on surfaces of the protruding parts 41, the working fluid in a liquid phase stays in the container inner surface area increasing unit 40 to be able to prevent dry-out of the working fluid in a liquid phase in the evaporation unit. In particular, in the vapor chamber 5, the second wick structure 52 also contacts the inner surface 32 of the second surface 22, whereby the working fluid in a liquid phase not only can flow back to the container inner surface area increasing unit 40 along the first surface 21 but also can flow back to the container inner surface area increasing unit 40 along the second surface 22, so that flow path resistance of the working fluid in a liquid phase is reduced, and reflux characteristics of the working fluid in a liquid phase to the container inner surface area increasing unit 40 are further improved. Further, since the projection portion 16 is provided at the evaporation unit in the vapor chamber 5, it is possible to easily secure an installation space for the container inner surface area increasing unit 40, and it is also possible to further increase a surface area of the evaporation unit on an inner surface of the container 10.

Figure 10:
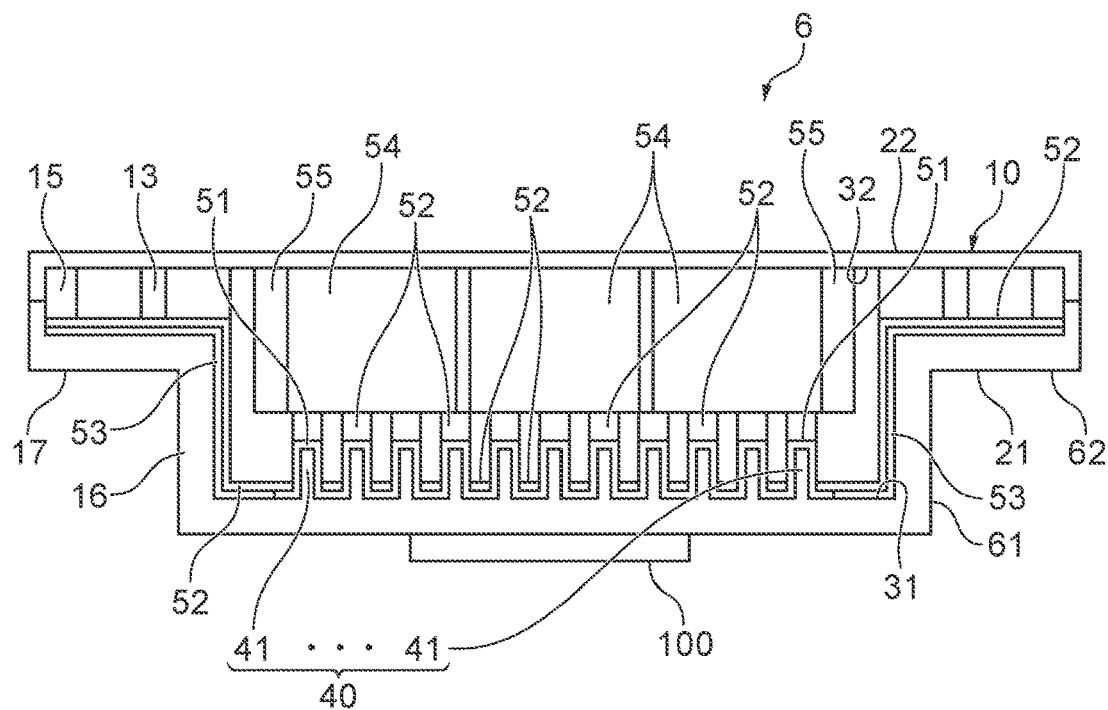
FIG. 10 is a sectional front view explaining an outline of an internal structure of a vapor chamber according to a sixth embodiment example of the present disclosure.
Figure 11:
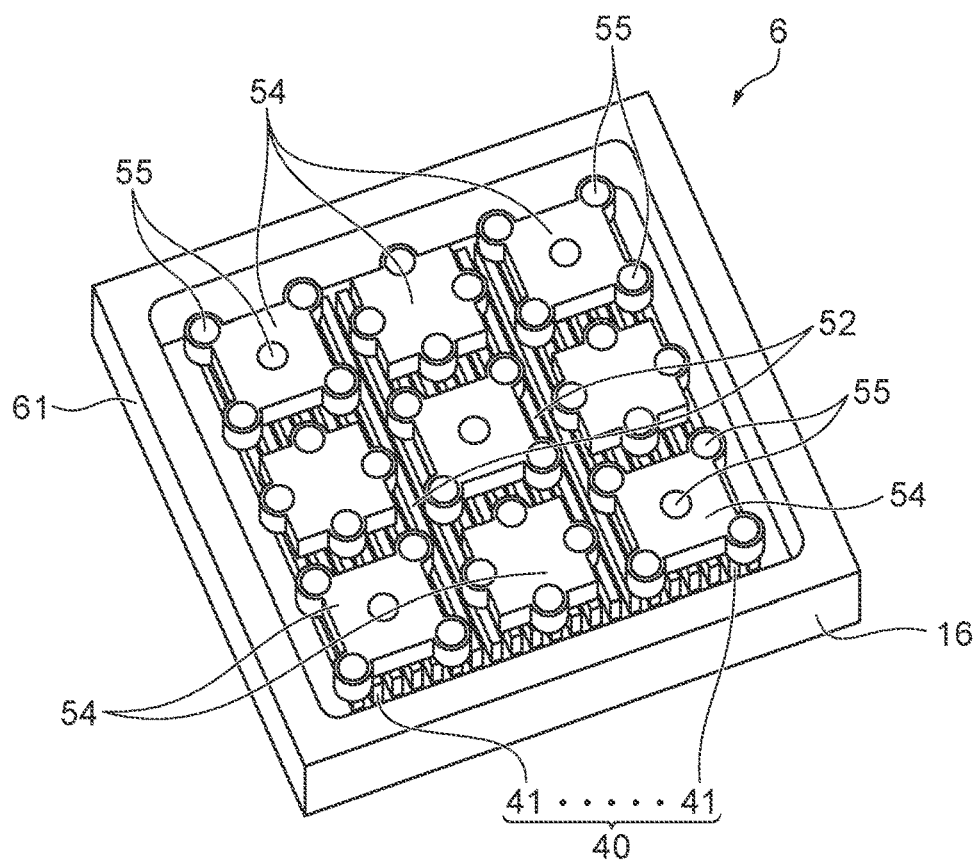
FIG. 11 is a perspective view explaining the outline of the internal structure of the vapor chamber according to the sixth embodiment example of the present disclosure.

Next, details of a vapor chamber according to a sixth embodiment example of the present disclosure will be described. FIG. 10 is a sectional front view explaining an outline of an internal structure of the vapor chamber according to the sixth embodiment example of the present disclosure. FIG. 11 is a perspective view explaining the outline of the internal structure of the vapor chamber according to the sixth embodiment example of the present disclosure. Note that in the vapor chamber according to the sixth embodiment example, main components are common to those in the vapor chambers according to the first to the fifth embodiment examples, and therefore, the same components as those of the vapor chambers according to the first to the fifth embodiment examples will be described by using the same reference signs.

In the vapor chamber 5 according to the fifth embodiment example, the container inner surface area increasing unit 40 is covered with the first wick structure 51, the second wick structure 52 is provided on the first wick structure 51, and the second wick structure 52 extends in the inner surface 32 direction of the second surface 22 from the protruding part 41, and contacts the inner surface 32 of the second surface 22. Instead of this, as shown in FIG. 10, in a vapor chamber 6 according to the sixth embodiment example, a second wick structure 52 extending in an inner surface 32 direction of a second surface 22 from a protruding part 41 does not contact an inner surface 32 of the second surface 22, and a sintered body block 54 formed of a sintered body of powder such as metal powder is provided between the second wick structure 52 and the inner surface 32 of the second surface 22. In the vapor chamber 6, the sintered body block 54 is in a mode of being placed on the second wick structure 52. The sintered body block 54 contacts a tip end of the second wick structure 52, and also contacts the inner surface 32 of the second surface 22. The sintered body block 54 is a block-shaped member that is separate from the second wick structure 52 and the second surface 22.

Note that in the vapor chamber 6, a container 10 has a planar portion 17 and a projection portion 16 projected in an outward direction from the planar portion 17, and a container inner surface area increasing unit 40 is provided on an inner surface of the projection portion 16.

A tip end of the second wick structure 52 opposes the inner surface 32 of the second surface 22, and the sintered body block 54 is provided between the second wick structure 52 and the inner surface 32 of the second surface 22, so that the second wick structure 52 is connected to the inner surface 32 of the second surface 22 via the sintered body block 54. The sintered body block 54 is a wick member having a porous structure, and has a capillary force. Accordingly, the vapor chamber 6 has a laminated structure of wick members formed of a first wick structure 51, the second wick structure 52 and the sintered body block 54.

The sintered body block 54 may be a wick member having the same structure as the first wick structure 51, the second wick structure 52 and/or a third wick structure 53, or may be a wick member having a different structure. When as a powder that is a raw material of the sintered body, the sintered body block 54 has the same powder as that of the first wick structure 51, the second wick structure 52 and/or the third wick structure 53, the sintered body block 54 has the same structure as those of the first wick structure 51, the second wick structure 52 and/or the third wick structure 53.

Further, instead of the projection part 42 functioning as the support member that maintains the cavity portion 13 that is decompressed by abutting on the second surface 22, the sintered body block 54 has a support pillar portion 55 along a thickness direction, and the support pillar portion 55 functions as a support member that maintains a cavity portion 13 that is decompressed, in the vapor chamber 6, as shown in FIG. 10.

As shown in FIGS. 10 and 11, on the container inner surface area increasing unit 40 provided on the inner surface of the projection portion 16, a plurality of sintered body blocks 54, 54, 54 . . . are disposed in parallel. The plurality of sintered body blocks 54, 54, 54 . . . are respectively disposed at predetermined intervals. Since the sintered body block 54 is divided into a plurality of sintered body blocks, it is possible to secure a vapor flow path 15 through which a working fluid in a gas phase flows throughout the entire projection portion 16. Further, the respective sintered body blocks 54 extend over a plurality of protruding parts 41, 41, 41 . . . .

Since the sintered body blocks 54 are provided between the second wick structures 52 and the inner surface 32 of the second surface 22 in the vapor chamber 6, a storage amount of the working fluid in a liquid phase in an evaporation unit increases, and reflux characteristics of the working fluid in a liquid phase to the evaporation unit are further improved. Further, since in the vapor chamber 6, the storage amount of the working fluid in a liquid phase in the evaporation unit increases, it is possible to more reliably prevent dry-out of the working fluid in a liquid phase in the evaporation unit. Further, in the vapor chamber 6, the container inner surface area increasing unit 40 having the protruding parts 41 is also formed on an inner surface 31 of a first surface 21 of the container 10, whereby an evaporation surface area for the working fluid in a liquid phase is increased to reduce thermal resistance at a time of the working fluid in a liquid phase changing in phase to a gas phase.

Next, other embodiment examples of the vapor chamber of the present disclosure will be described. In each of the above described embodiment examples, the second wick structure is a wick structure having a smaller capillary force than the first wick structure, but instead of this, the second wick structure may be a wick structure having an equivalent capillary force to that of the first wick structure, or may be a wick structure having a larger capillary force than that of the first wick structure. Further, as another embodiment example of the vapor chamber of the present disclosure, the first wick structure may extend in an inner surface direction of a second surface from a tip end of a protruding part, and contact an inner surface of the second surface, instead of the second wick structure. In other words, the second wick structure may be a wick structure having the same structure as that of the first wick structure. When both the second wick structure and the first wick structure are sintered bodies of powder, the same powder is used in the second wick structure and the first wick structure, that is, the same powder is used as the first powder and the second powder, as a powder that is a raw material. In the above-described mode, the container inner surface area increasing unit contacts the inner surface of the second surface via the first wick structure.

Further, in each of the above-described embodiment examples, the third wick structure is a wick structure having a smaller capillary force than that of the first wick structure, but instead of this, the third wick structure may be a wick structure having an equivalent capillary force to that of the first wick structure, or may be a wick structure having a larger capillary force than that of the first wick structure. Further, as another embodiment example of the vapor chamber of the present disclosure, the first wick structure may be provided in a part where the container inner surface area increasing unit is not formed, on the inner surface of the first surface, instead of the third wick structure. In other words, the third wick structure may be a wick structure having the same structure as that of the first wick structure. When the third wick structure and the first wick structure are both sintered bodies of powder, as the power that is a raw material, the same powder is used in the third wick structure and the first wick structure, that is, the same powder is used as the first powder and the third powder.

Further, as another embodiment example of the vapor chamber of the present disclosure, instead of the second wick structure, a first wick structure may extend in an inner surface direction of a second surface from a tip end of a protruding part, and contact the inner surface of the second surface, and instead of the third wick structure, the first wick structure may be provided in a part where a container inner surface area increasing unit is not formed, on an inner surface of a first surface. In other words, the second wick structure and the third wick structure may be wick structures having the same structure as that of the first wick structure. When the first wick structure, the second wick structure and the third wick structure are all sintered bodies of powder, as the powder that is a raw material, the same powder is used in the first wick structure, the second wick structure and the third wick structure, that is, the same powder is used as the first powder, the second powder and the third powder.

Further, in each of the above-described embodiment examples, the container inner surface area increasing unit is provided on the first surface that is the first main surface, of the two main surfaces of the container, but container inner surface area increasing units may be provided on both the two main surfaces of the container, that is, the container inner surface area increasing unit may be provided not only on the first surface but also on the second surface that is the second main surface.

The vapor chamber of the present disclosure has excellent heat transport properties by reducing thermal resistance at the time of the working fluid in a liquid phase changing in phase to a gas phase, and preventing dry-out of the working fluid in a liquid phase in the evaporation unit, so that the vapor chamber is usable in a wide heat transport field, and has a high utility value in a field of cooling high-heat-generating elements mounted in narrow spaces, for example.

What is claimed is:

1. A vapor chamber comprising a container having a cavity portion formed inside, and including a first plate-shaped body and a second plate-shaped body opposing the first plate-shaped body, a working fluid sealed in the cavity portion, and a vapor flow path through which the working fluid in a gas phase flows, the vapor flow path being provided in the cavity portion, wherein the container is formed by overlapping the first plate-shaped body and the second plate-shaped body opposing the first plate-shaped body, wherein an evaporator including a protruding part is formed on an inner surface of the first plate-shaped body, a first wick structure is provided on a surface of the protruding part, a third wick structure is provided outside the evaporator, on the first plate-shaped body, and the third wick structure is connected to the first wick structure, wherein a second wick structure is further provided on the first wick structure, the second wick structure comprising a first plurality of second wick structures and, a second plurality of second wick structures, a vertically laminated structure of wick structures having the first wick structure and one of the first plurality of second wick structures, wherein the vertically laminated structure of wick structures is between a top surface of the protruding part and an inner surface of the second plate-shaped body, the one of the first plurality of second wick structures extends in an inner surface direction of the second plate-shaped body from a tip end of the protruding part, and contacts the inner surface of the second plate-shaped body, the evaporator includes a plurality of protruding parts comprising the protruding part, and the plurality of protruding parts are separated from each other by 0.4 mm or more, one of the second plurality of second wick structures is provided on the first wick structure and between the plurality of protruding parts, wherein the one of the second plurality of second wick structures is separated from another one of the second plurality of second wick structures by one protruding part of the plurality of protruding parts, the cavity portion is formed between the first plurality of second wick structures, projection parts that project to the second plate-shaped body from the tip ends of the protruding parts and are disposed in another inner surface direction are provided at some protruding parts of the plurality of protruding parts, the projection parts next to each other are connected by the first plurality of second wick structures, and the inner surface of the second plate-shaped body is included in the vapor flow path.

2. The vapor chamber according to claim 1, wherein a ratio of a height of the protruding part to a thickness of the protruding part is 1.0 or more and 3.0 or less.

3. The vapor chamber according to claim 1, wherein a thickness of the first wick structure is 0.1 mm or more and 1.0 mm or less.

4. The vapor chamber according to claim 1, wherein the surface of the protruding part is covered with the first wick structure.

5. The vapor chamber according to claim 4, wherein the first wick structure extends among the plurality of the protruding parts on the inner surface of the first plate-shaped body.

6. The vapor chamber according to claim 1, wherein the first wick structure extends among the plurality of the protruding parts on the inner surface of the first plate-shaped body.

7. The vapor chamber according to claim 1, wherein the second wick structure has a smaller capillary force than the first wick structure.

8. The vapor chamber according to claim 7, wherein the one of the first plurality of second wick structures is further provided on the first wick structure among the plurality of the protruding parts on the inner surface of the first plate-shaped body.

9. The vapor chamber according to claim 1, wherein the one of the first plurality of second wick structures contacts the inner surface of the second plate-shaped body.

10. The vapor chamber according to claim 1, wherein the one of the first plurality of second wick structures is further provided on the first wick structure among the plurality of the protruding parts on the inner surface of the first plate-shaped body.

11. The vapor chamber according to claim 1, wherein the first wick structure is a sintered body of powder, and the second wick structure is a sintered body of powder.

12. The vapor chamber according to claim 11, wherein an average primary particle size of a first powder that is a raw material of the first wick structure is smaller than an average primary particle size of a second powder that is a raw material of the second wick structure.

13. The vapor chamber according to claim 1, wherein the evaporator comprises plate-shaped fins, pin fins and/or recesses.

14. The vapor chamber according to claim 1, wherein an entire first planar-shaped body is a planar part, and the evaporator is formed on an inner surface of the planar part.

15. The vapor chamber according to claim 1, wherein the container includes a planar portion and a projection portion projected in an outward direction from the planar portion.

16. The vapor chamber according to claim 1, wherein a block-shaped wick member is further provided between the first plurality of second wick structures and the second plate-shaped body.

17. The vapor chamber according to claim 1, wherein the one of the second plurality of second wick structures is further provided between the cavity portion and the first wick structure.

* * * * *